(12) United States Patent
Huang

(10) Patent No.: US 8,417,194 B2
(45) Date of Patent: Apr. 9, 2013

(54) COMPENSATION DEVICE APPLIED TO POWER AMPLIFIER, METHOD FOR DETERMINING PRE-DISTORTION OF POWER AMPLIFIER, AND METHOD FOR COMPENSATING LINEARITY OF POWER AMPLIFIER THEREOF

(75) Inventor: Ming-Chung Huang, Taichung (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 151 days.

(21) Appl. No.: 13/156,349

(22) Filed: Jun. 9, 2011

(65) Prior Publication Data
US 2011/0304390 A1 Dec. 15, 2011

(30) Foreign Application Priority Data
Jun. 11, 2010 (TW) .............................. 99119085 A

(51) Int. Cl.
H04B 1/04 (2006.01)
H04B 17/00 (2006.01)

(52) U.S. Cl. ............... 455/114.3; 455/67.13; 455/127.2; 375/297; 330/149

(58) Field of Classification Search ............... 455/67.11, 455/67.13, 114.1, 114.2, 114.3, 115.1, 115.3, 455/127.2; 375/296, 297; 330/127, 149
See application file for complete search history.

(56) References Cited

U.S. PATENT DOCUMENTS

| | | | | |
|---|---|---|---|---|
| 6,240,144 B1* | 5/2001 | Ha | ............... | 375/297 |
| 6,246,286 B1* | 6/2001 | Persson | ............... | 330/149 |
| 6,275,685 B1* | 8/2001 | Wessel et al. | ............... | 455/114.3 |
| 6,680,648 B2* | 1/2004 | Nguyen et al. | ............... | 330/149 |
| 7,403,573 B2 | 7/2008 | DeBruyn et al. | | |
| 8,090,051 B2* | 1/2012 | Hoyerby et al. | ............... | 375/297 |

* cited by examiner

Primary Examiner — Quochien B Vuong
(74) Attorney, Agent, or Firm — Winston Hsu; Scott Margo

(57) ABSTRACT

A method for determining pre-distortion of a power amplifier includes the following steps: providing a first power input signal to make the power amplifier generate a first power output signal; receiving a first receiving signal, which is acquired according to the first power output signal; detecting a predetermined gain of the power amplifier by means of the first power input signal and the first receiving signal; providing a second power input signal to make the power amplifier generate a second power output signal; receiving a second receiving signal, which is acquired according to the second power output signal; determining pre-distortion amplitude values and pre-distortion phase values of the power amplifier by means of the predetermined gain, the second power input signal and the second receiving signal.

15 Claims, 11 Drawing Sheets

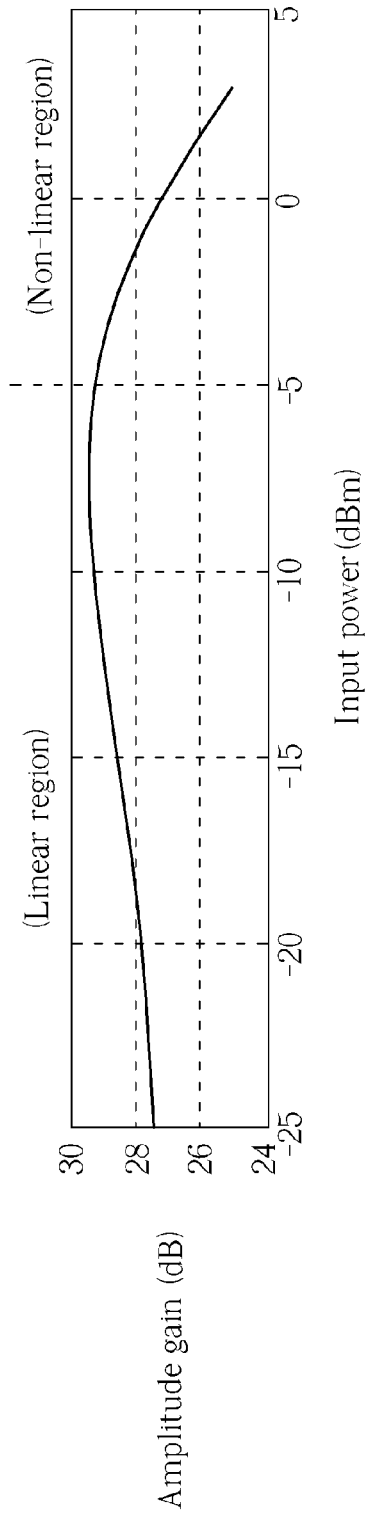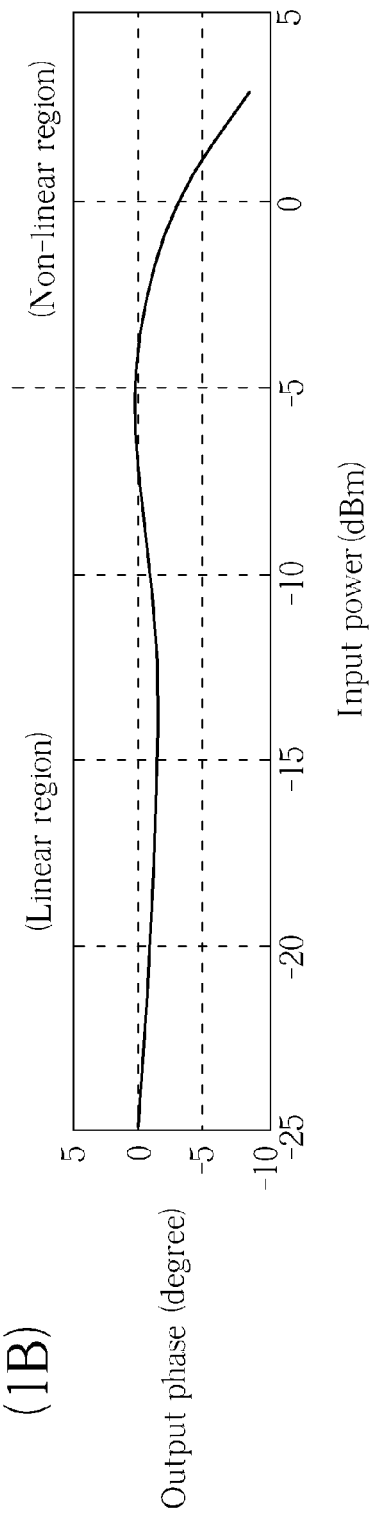
FIG. 1

| Input signal | Pre-distortion amplitude value ($A_{PD}$) | Pre-distortion phase value ($\theta_{PD}$) |
|---|---|---|
| ($I_{m1}, Q_{m1}$) | $A_{PD1}$ | $\theta_{PD1}$ |
| ($I_{m2}, Q_{m2}$) | $A_{PD2}$ | $\theta_{PD2}$ |
| ($I_{m3}, Q_{m3}$) | $A_{PD3}$ | $\theta_{PD3}$ |
| ⋮ | ⋮ | ⋮ |
| ⋮ | ⋮ | ⋮ |
| ($I_{mn}, Q_{mn}$) | $A_{PDn}$ | $\theta_{PDn}$ |

FIG. 5

| Pre-distortion amplitude value ($A_{PD}$) | Second Pre-distortion amplitude value ($A_{PD}'$) | Pre-distortion phase value ($\theta_{PD}$) | Second Pre-distortion phase value ($\theta_{PD}'$) |
|---|---|---|---|
| $A_{PD1}$ | $A_{PD11}$ | $\theta_{PD1}$ | $\theta_{PD11}$ |
|  | $A_{PD12}$ |  | $\theta_{PD12}$ |
|  | ⋮ |  | ⋮ |
| $A_{PD2}$ | $A_{PD21}$ | $\theta_{PD2}$ | $\theta_{PD21}$ |
|  | $A_{PD22}$ |  | $\theta_{PD22}$ |
|  | ⋮ |  | ⋮ |
| $A_{PD3}$ | $A_{PD31}$ | $\theta_{PD3}$ | $\theta_{PD31}$ |
|  | $A_{PD32}$ |  | $\theta_{PD32}$ |
|  | ⋮ |  | ⋮ |
| ⋮ | ⋮ | ⋮ | ⋮ |
| $A_{PDn}$ |  | $\theta_{PDn}$ |  |

FIG. 6

COMPENSATION DEVICE APPLIED TO POWER AMPLIFIER, METHOD FOR DETERMINING PRE-DISTORTION OF POWER AMPLIFIER, AND METHOD FOR COMPENSATING LINEARITY OF POWER AMPLIFIER THEREOF

BACKGROUND OF THE INVENTION

1. Field of the Invention

The present invention relates to compensation device applied to a power amplifier and a related method, and more particularly, to a compensation device and a related method for determining pre-distortion amplitude values and pre-distortion phase values of the power amplifier according to a predetermined gain of the power amplifier, a power input signal with different amplitude intensities, and a receiving signal corresponding to the power input signal.

2. Description of the Prior Art

In today's integrated circuits, power amplifiers have been widely applied to various kinds of application circuits, such as a communication system. Generally speaking, a power amplifier can be used as a gain stage for amplifying an input signal. However, the linearity of the power amplifier is not ideal in practice.

Please refer to FIG. 1 (including sub-diagrams 1A and 1B), wherein 1A is a diagram illustrating an amplitude modulation distortion curve (AM-AM curve) of a power amplifier, and 1B is a diagram illustrating a phase modulation distortion curve (AM-PM curve) of a power amplifier. As shown in 1A, when the power amplifier operates under a linear region, the amplitude gain of the power amplifier is approximately maintained at a fixed value. When the power of an input signal is continuously increasing, the amplitude gain of the power amplifier will be decreased instead, which is namely the so-called AM-AM effect. As shown in 1B, when the power amplifier operates under a linear region, the phase of the power amplifier (i.e., the phase between the power of the input signal and the power of its output signal) is approximately maintained at a fixed value. When the power of the input signal is continuously increasing, the phase of the power amplifier will be changed (decreased) instead, which is namely the so-called AM-PM effect. As one can see, the AM-AM effect and the AM-PM effect occur when the power amplifier operates under a non-linear region.

However, users usually hope that operations of the application circuit (s) are linear operations, and thus there are multiple relationships existed between all parameters. If the application circuit operates under a non-linear region, it may induce many harmonics and affect other channels. In this way, it may result in a poor communication quality.

SUMMARY OF THE INVENTION

It is therefore one of the objectives of the present invention to provide a method for determining pre-distortion values of a power amplifier, a method for compensating linearity of a power amplifier, and a compensation device applied to a power amplifier to solve the abovementioned problems.

According to an exemplary embodiment of the present invention, a compensation device applied to a power amplifier is provided. The compensation device includes a power signal generator, a receiving circuit, a gain detecting circuit, and a pre-distortion determining circuit. The power signal generator may be arranged to provide a first power input signal with a fixed amplitude intensity to the power amplifier, and arranged to provide a second power input signal with different amplitude of intensities to the power amplifier, wherein the power amplifier generates a first power output signal according to the first power input signal, and generates a second power output signal according to the second power input signal. The receiving circuit may be arranged to receive a first receiving signal and a second receiving signal, wherein the first receiving signal is corresponding to the first power output signal, and the second receiving signal is corresponding to the second power output signal. The gain detecting circuit is coupled to the power signal generator and the receiving circuit, and may be arranged to detect a predetermined gain of the power amplifier by means of the first power input signal and the first receiving signal. The pre-distortion determining circuit is coupled to the power signal generator, the receiving circuit, and the gain detecting circuit may be arranged to determining a plurality of pre-distortion amplitude values and a plurality of pre-distortion phase values of the power amplifier by means of the predetermined gain, the second input signal and the second receiving signal.

According to another exemplary embodiment of the present invention, a method for determining pre-distortion values of a power amplifier is provided. The method includes the following steps: providing a first power input signal to make the power amplifier generate a first power output signal, wherein an amplitude of the first power input signal has a fixed amplitude intensity; receiving a first receiving signal, wherein the first receiving signal is acquired according to the first power output signal; detecting a predetermined gain of the power amplifier by means of the first power input signal and the first receiving signal; providing a second power input signal to make the power amplifier generate a second power output signal, wherein an amplitude of the second power input signal has different amplitude intensities; receiving a second receiving signal, wherein the second receiving signal is acquired according to the second power output signal; and determining a plurality of pre-distortion amplitude values and a plurality of pre-distortion phase values of the power amplifier by means of the predetermined gain, the second power input signal, and the second receiving signal.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 (including sub-diagrams 1A and 1B) is a diagram illustrating an amplitude modulation distortion curve and a phase modulation distortion curve of a power amplifier.

FIG. 5 is a diagram illustrating an exemplary embodiment of the lookup table shown in FIG. 4.

FIG. 6 is a diagram illustrating an exemplary embodiment of the second pre-distortion amplitude value and the second pre-distortion phase value generated by the interpolation operating circuit shown in FIG. 4.

DETAILED DESCRIPTION

Figure 2:
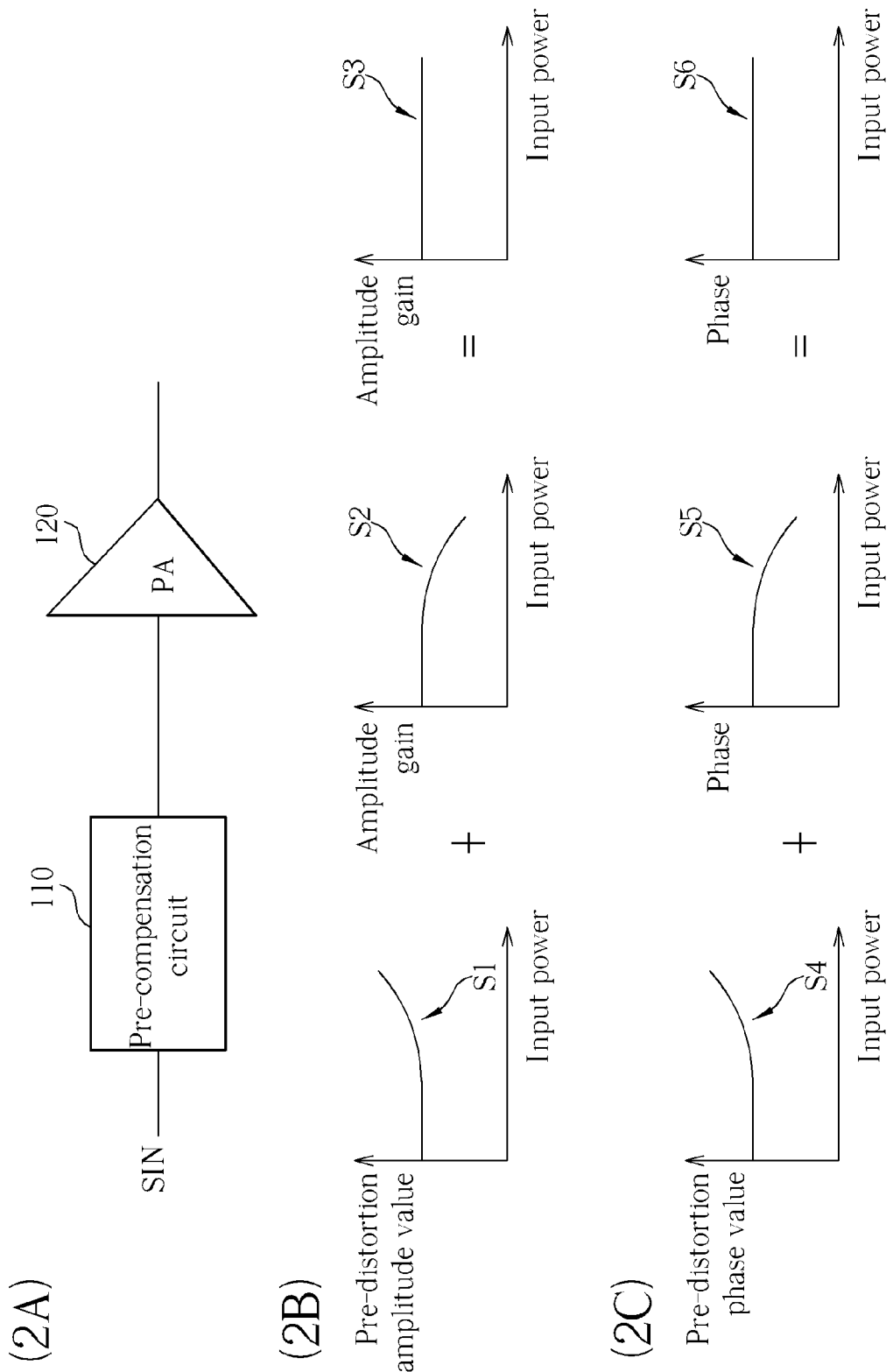
FIG. 2 (including sub-diagrams 2A, 2B, and 2C) is a diagram illustrating an amplitude compensation curve and a phase compensation curve applied to a power amplifier.

First, a brief description for the concept of the present invention is given in order to help understanding of the technical features disclosed in the present invention. Please refer to FIG. 2. FIG. 2 (including sub-diagrams 2A, 2B, and 2C) is a diagram illustrating an amplitude compensation curve and a phase compensation curve applied to a power amplifier. As shown in 2A, the linearity of a power amplifier 120 is in fact not ideal, and thus a pre-compensation circuit 110 (or a pre-distortion circuit) is disposed in a front stage of the power amplifier 120. As a result, before an input signal SIN is inputted into the power amplifier 110, the pre-compensation circuit 110 is configured to compensate the input signal SIN in advance according to a target pre-distortion amplitude value and a target pre-distortion phase value. AS shown in 2B, a plurality of pre-distortion amplitude values constitute an amplitude compensation curve S1. Since the amplitude compensation curve S1 is an inverse of an amplitude modulation distortion curve S2 of the power amplifier 120, a resultant amplitude gain curve S3 is generated after adding them together. As shown in 2C, a plurality of pre-distortion phase values constitute a phase compensation curve S4. Since the phase compensation curve S4 is an inverse of a phase modulation distortion curve S5 of the power amplifier 120, a resultant phase curve S6 is generated after adding them together. As can be known from FIG. 2, the resultant amplitude gain curve S3 and the resultant phase curve S6 each having a fixed value can be acquired after the compensation of the pre-compensation circuit 110 (including the amplitude compensation curve S1 and the phase compensation curve S4). Therefore, the problem that the power amplifier 120 operates in the non-linear region can be solved.

Figure 3:
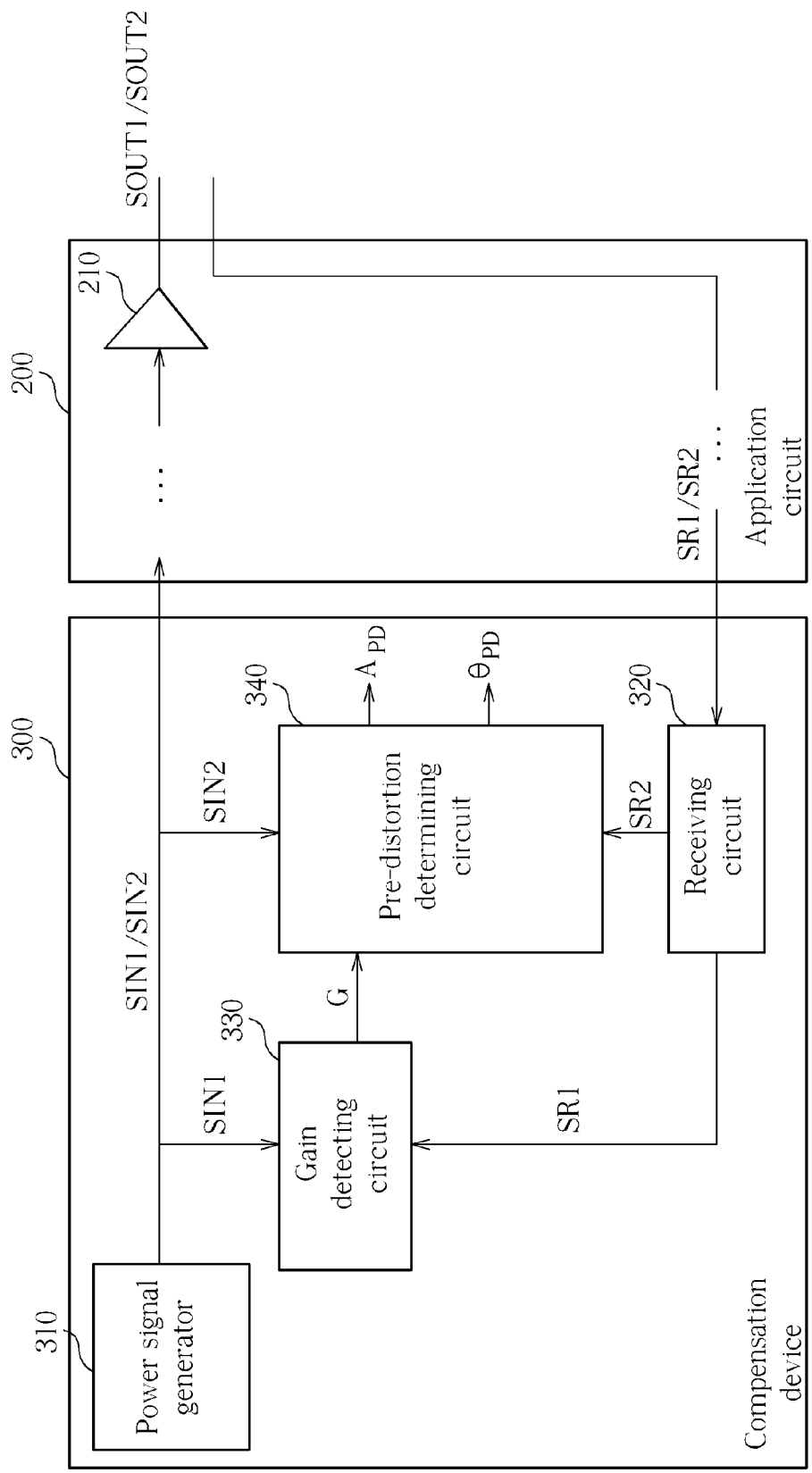
FIG. 3 is a block diagram of a compensation device applied to a power amplifier according to a first embodiment of the present invention.

Please refer to FIG. 3. FIG. 3 is a block diagram of a compensation device 300 applied to a power amplifier according to a first embodiment of the present invention. Generally speaking, a power amplifier 210 can be applied to an application circuit 200 (such as, a communication system). To facilitate the description, only the power amplifier 210 is shown and other components of the application circuit 200 are omitted in this embodiment. As shown in FIG. 3, the compensation device 300 may include, but is not limited to, a power signal generator 310, a receiving circuit 320, a gain detecting circuit 330, and a pre-distortion determining circuit 340. First, the power signal generator 310 is arranged to provide a first power input signal (such as, SIN1) to the power amplifier 210, such that the power amplifier 210 generates a first power output signal SOUT1 according to the first power input signal SIN1. At this time, the application circuit 200 acquires a first receiving signal SR1 according to the first power output signal SOUT1. After that, the power signal generator 310 is further arranged to provide a second power input signal SIN2 to the power amplifier 210, such that the power amplifier 210 generates a second power output signal SOUT2 according to the second power input signal SIN2. At this time, the application circuit 200 acquires a second receiving signal SR2 according to the second power output signal SOUT2. Please note that: the first power input signal SIN1 has a fixed amplitude intensity, and the second power input signal SIN2 has different amplitude intensities. In addition, the receiving circuit 320 is arranged to receive the first receiving signal SR1 and the second receiving signal SR2.

In addition, the gain detecting circuit 330 is coupled to the power signal generator 310 and the receiving circuit 320, and is arranged to detect a predetermined gain G of the power amplifier 210 by means of the first power input signal SIN1 and the first receiving signal SR1. What calls for special attention is that: the power amplifier 210 operates under a linear region to generate the first power output signal SOUT1, and the first receiving signal SR1 is acquired according to the first power output signal SOUT1. In other words, the predetermined gain G detected by the gain detecting circuit 330 is the gain of the power amplifier 210 operating under the linear region. Furthermore, the pre-distortion determining circuit 340 is coupled to the power signal generator 310, the receiving circuit 320, and the gain detecting circuit 340, and is arranged to determining a plurality of pre-distortion amplitude values $A_{PD}$ and a plurality of pre-distortion phase values $\theta_{PD}$ of the power amplifier 210 by means of the predetermined gain G, the second power input signal SIN2 with different amplitude intensities, and the second receiving signal SR2 with corresponding different amplitude intensities. Details and operations related to the gain detecting circuit 330 and the pre-distortion determining circuit 340 will be further explained in the following embodiments.

Figure 4:
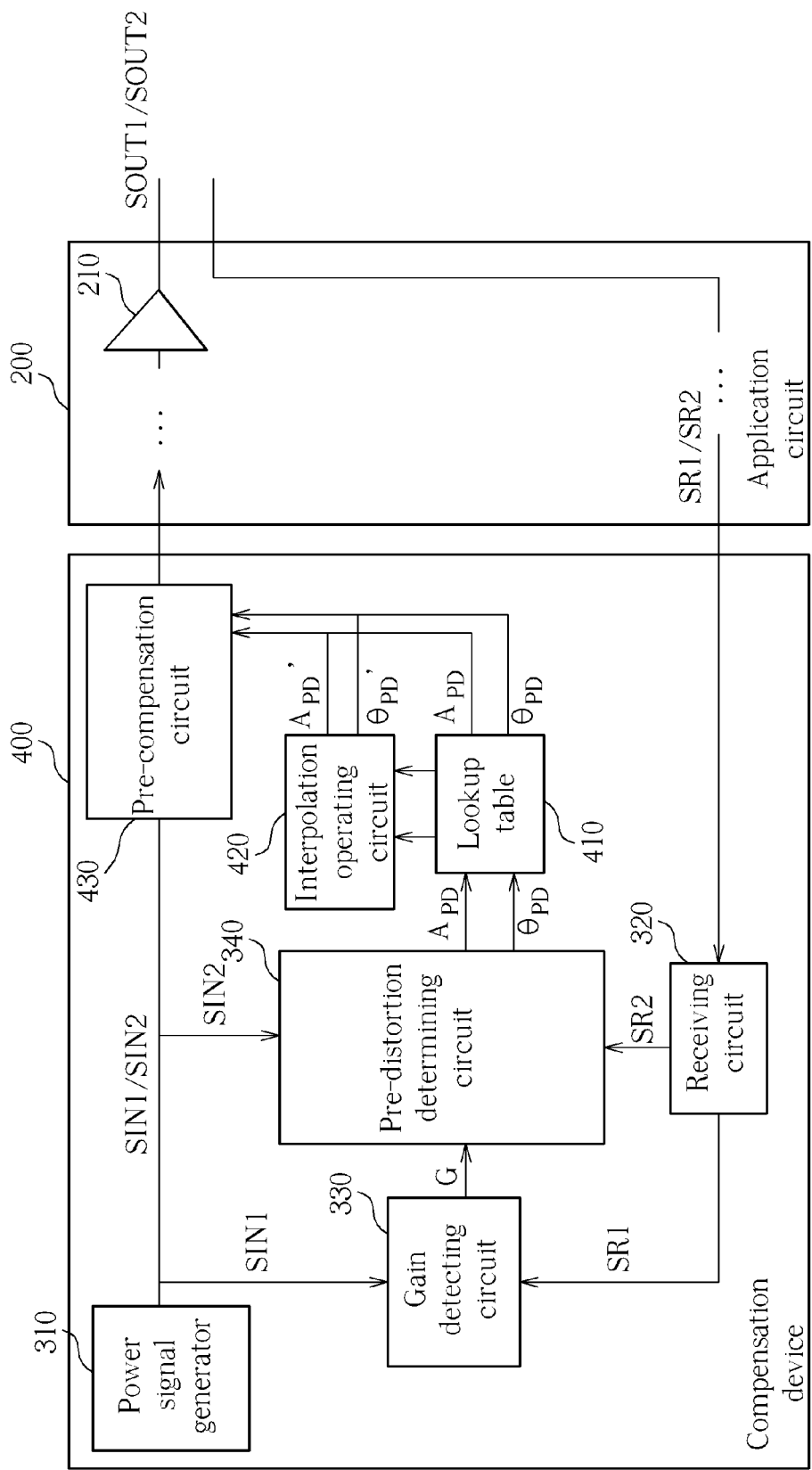
FIG. 4 is a block diagram of a compensation device applied to a power amplifier according to a second embodiment of the present invention.

Please refer to FIG. 4. FIG. 4 is a block diagram of a compensation device 400 applied to a power amplifier according to a second embodiment of the present invention. The architecture of the compensation device 400 is similar to that of the compensation device 300 shown in FIG. 3, and the difference between them is that the compensation device 400 further includes a lookup table 410, an interpolation operating circuit 420, and a pre-compensation circuit 430. The lookup table 410 is coupled to the pre-distortion determining circuit 340, and is composed of the plurality of pre-distortion amplitude values $A_{PD}$ and the plurality of pre-distortion phase values $\theta_{PD}$, which can be presented as the lookup table 50 shown in FIG. 5. Generally speaking, the capacity of the lookup table 410 may be restricted, and thus the interpolation operating circuit 420 can be collocated together in order to save memory space. The interpolation operating circuit 420 is coupled to the lookup table 410, and may be arranged to generate one or a plurality of second pre-distortion amplitude values $A_{PD}'$ according to the plurality of pre-distortion amplitude values $A_{PD}$ by using an interpolation algorithm, and may be arranged to generate one or a plurality of second pre-distortion phase values $\theta_{PD}'$ according to the plurality of pre-distortion phase values $\theta_{PD}$ by using the interpolation algorithm, which can be presented as the lookup table 60 shown in FIG. 6. After that, the pre-compensation circuit 430 is disposed in a front stage of the power amplifier 210 and coupled to the lookup table 410 and the interpolation operating circuit 420. Therefore, before an input signal is inputted into the power amplifier 210, the pre-compensation circuit 430 compensates the input signal in advance according to a target pre-distortion amplitude value and a target pre-distortion phase value by referring to the plurality of pre-distortion amplitude values $A_{PD}$ and the plurality of pre-distortion phase values $\theta_{PD}$ (or the plurality of second pre-distortion amplitude values $A_{PD}'$ and the plurality of second pre-distortion phase values $\theta_{PD}'$).

Certainly, the abovementioned embodiments are merely used for illustrating the features of the present invention, and in no way should be considered as a limitation of the present invention. Those skilled in the art should appreciate that various modifications of the compensation device 300/400 applied to the power amplifier may be made without departing from the spirit of the present invention, which also belongs to the scope of the present invention.

In the following descriptions, how the gain detecting circuit 330 detects the predetermined gain of the power amplifier 210 and how the pre-distortion determining circuit 340 determines the plurality of pre-distortion amplitude values $A_{PD}$ and the plurality of pre-distortion phase values $\theta_{PD}$ of the power amplifier 210 will be further illustrated.

Figure 7:
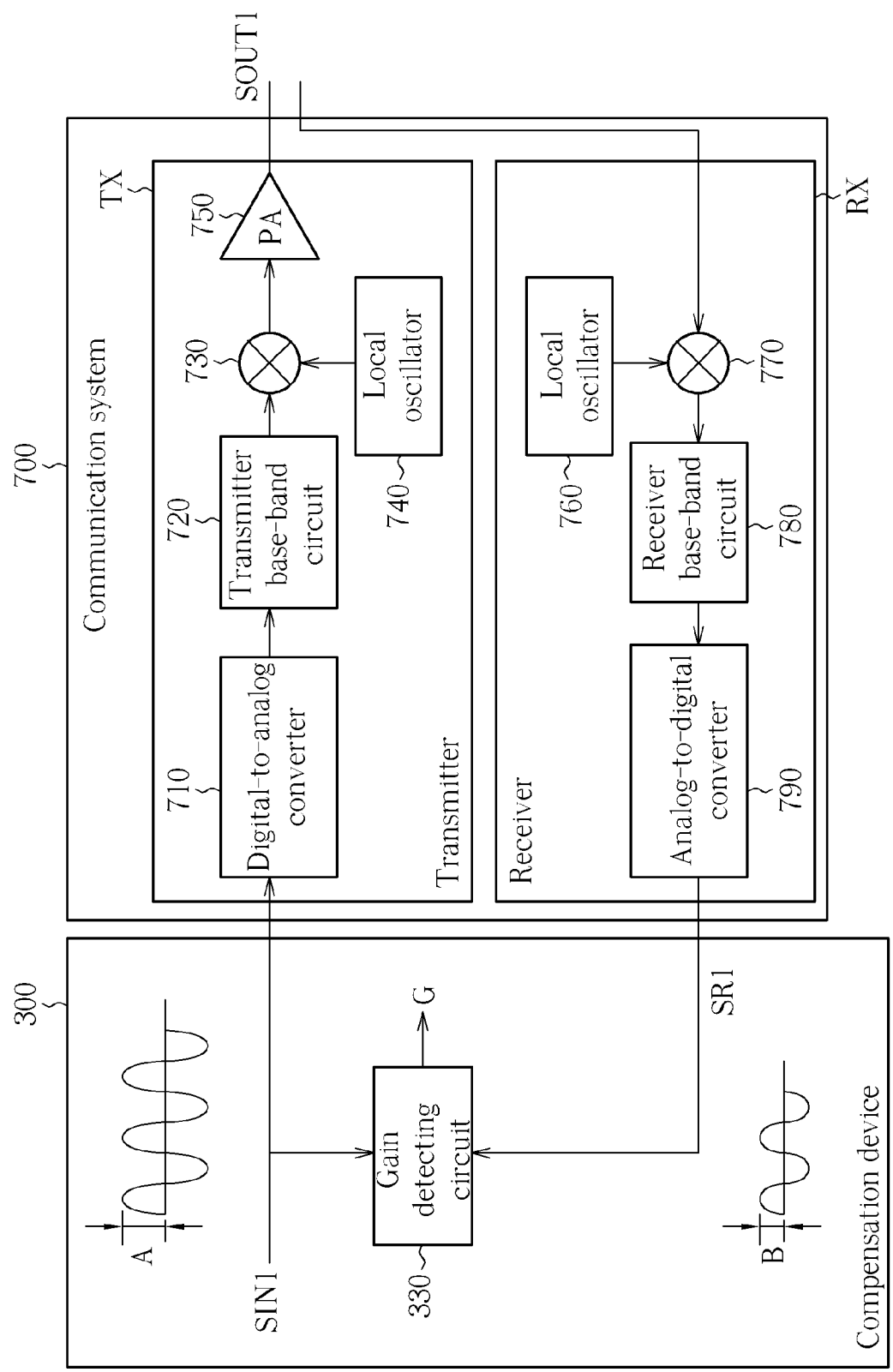
FIG. 7 is a diagram illustrating how the gain detecting circuit shown in FIG. 3 or FIG. 4 detects the predetermined gain of the power amplifier by using the first power input signal and the first receiving signal.

Please refer to FIG. 7. FIG. 7 is a diagram illustrating how the gain detecting circuit shown in FIG. 3 or FIG. 4 detects the predetermined gain of the power amplifier 210 by using the first power input signal SIN1 and the first receiving signal SR1. To facilitate the description, only the gain detecting circuit 330 is shown and other components of the compensation circuit 300 are omitted in this embodiment. In this embodiment, the application circuit is implemented by using a communication system 700 as an example, but the present invention is not limited to this only. As shown in FIG. 7, the communication system 700 usually includes a transmitter TX and a receiver RX. Herein the transmitter TX may include a digital-to-analog converter 710, a transmitter base-band circuit 720, a mixer 730, a local oscillator 740, and a power amplifier 750, and the receiver RX may include a local oscillator 760, a mixer 770, a receiver base-band circuit 780 and an analog-to-digital converter 790. As abovementioned, the power signal generator 310 may provide the first power input signal SIN1 to the power amplifier 210, such that the power amplifier 210 may generate the first power output signal SOUT1 according to the first power input signal SIN1. At this time, the communication system 700 may obtain a first receiving signal SR1 according to the first power output signal SOUT1. Please note that, the first power input signal SIN1 has a fixed amplitude intensity A, and thus the acquired first receiving signal SR1 also has a fixed amplitude intensity B.

As can be known, the gain detecting circuit 330 can be represented by the following equation:

$$G=P_{R1}-P_{IN1} \quad (1).$$

Herein G represents the predetermined gain of the power amplifier 750, $P_{R1}$ represents a power of the first receiving signal SR1, and $P_{IN1}$ represents a power of the first power input signal SIN1. What calls for special attention is that: the power amplifier 750 operates under a linear region to generate the first power output signal SOUT1, wherein the first receiving signal SR1 is acquired according to the first power output signal SOUT1. In other words, the predetermined gain G detected by the gain detecting circuit 330 is the gain of the power amplifier 750 operating under the linear region.

Figure 8:
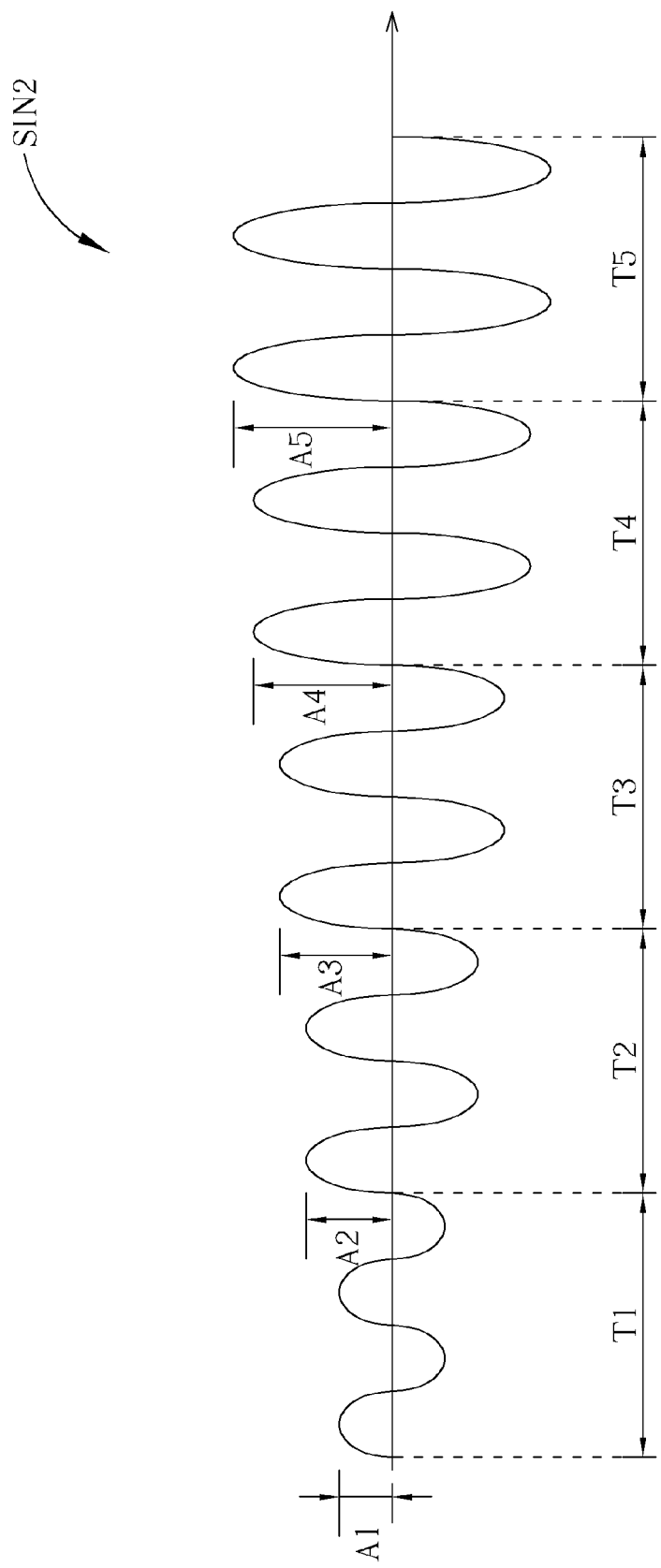
FIG. 8 is a waveform diagram illustrating the second power input signal with different amplitude intensities provided by the power signal generator shown in FIG. 3 or FIG. 4.
Figure 9:
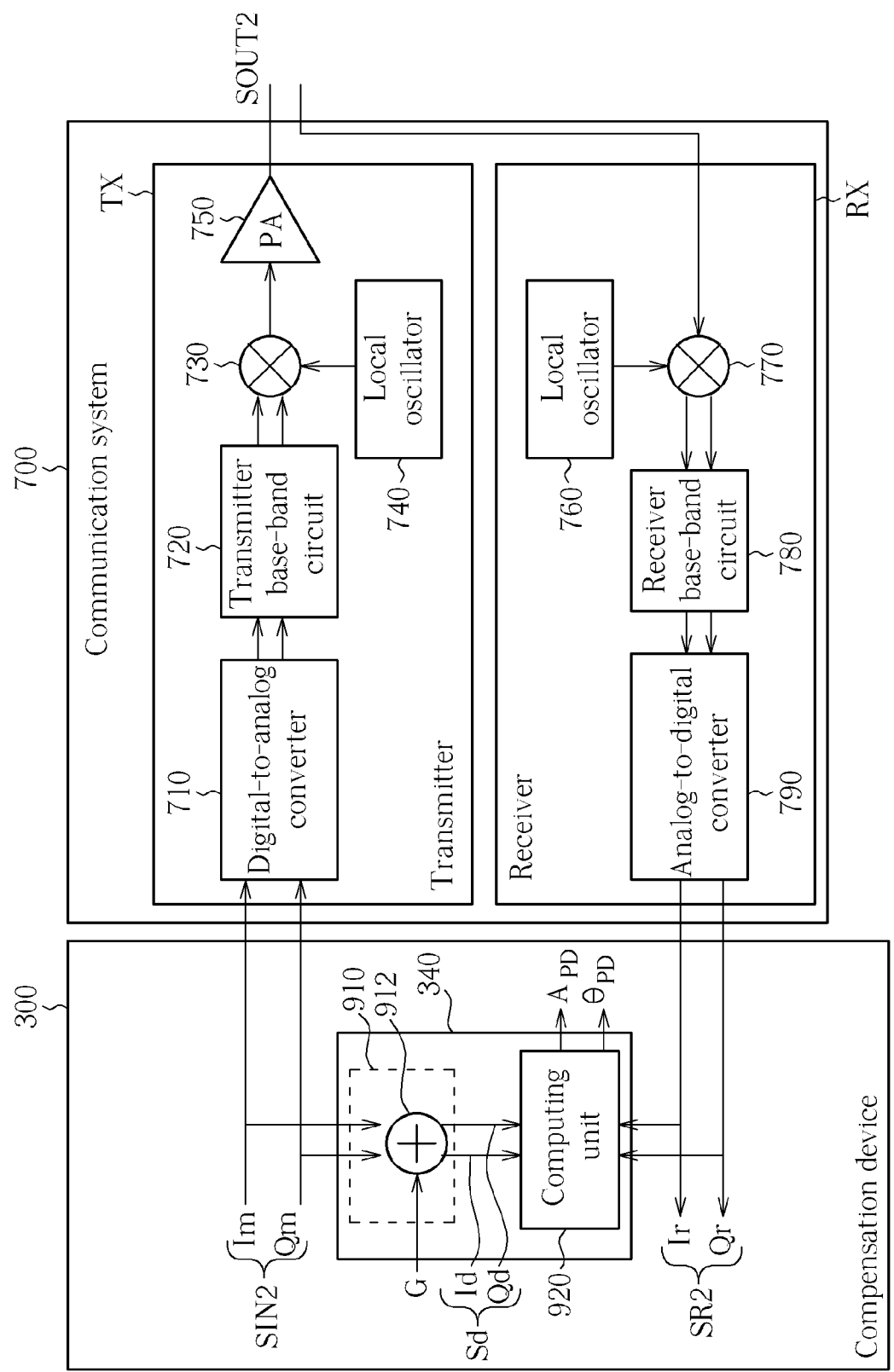
FIG. 9 is a diagram illustrating an exemplary embodiment of the pre-distortion determining circuit shown in FIG. 3 or FIG. 4.

Please refer to FIG. 8 together with FIG. 9. FIG. 8 is a waveform diagram illustrating the second power input signal SIN2 with different amplitude intensities provided by the power signal generator 310 shown in FIG. 3 or FIG. 4, and FIG. 9 is a diagram illustrating an exemplary embodiment of the pre-distortion determining circuit 340 shown in FIG. 3 or FIG. 4.

As shown in FIG. 8, the second power input signal SIN2 has different amplitude intensities. Since the second receiving signal SR2 will be acquired by the communication system 700 after a period of time when the second power input signal SIN2 passes through the communication system 700, each amplitude intensity of the second power input signal SIN2 must continue for a fixed time. For example, during the period of time T1, the amplitude intensity of the second power input signal SIN2 is maintained at A1; during the period of time T2, the amplitude intensity of the second power input signal SIN2 is maintained at A2; and so on. Please note that, in one embodiment, the amplitude intensities of the second power input signal SIN2 can be monotonic-increasing or monotonic-decreasing, but the present invention is not limited to this only. Those skilled in the art should appreciate that various modifications of the amplitude of the second power input signal SIN2 may be made without departing from the spirit of the present invention, which also belongs to the scope of the present invention.

In FIG. 9, to facilitate the description, only the pre-distortion determining circuit 340 is shown and other components of the compensation device 300 are omitted in this embodiment. In this embodiment, the application circuit is implemented by using the communication system as an example. In FIG. 9, the pre-distortion determining circuit 340 can be implemented by a designated output signal generator 910 and a computing unit 920. The designated output signal generator 910 is arranged to obtain a designated output signal Sd (being represented by (Id, Qd) in this embodiment) according to the predetermined gain G and the second power input signal SIN2 (being represented by (Im, Qm) in this embodiment). In this example, an adder 912 is used for implementing the designated output signal generator 910, and thus the designated output signal Sd is a sum of the second power input signal SIN2 and the predetermined gain G. The computing unit 920 is coupled to the designated output signal generator 910, and is arranged to perform a subtraction upon the designated output signal Sd and the second receiving signal SR2 (being represented by (Ir, Qr) in this embodiment) in order to obtain the plurality of pre-distortion amplitude values $A_{PD}$ and the plurality of pre-distortion phase values $\theta_{PD}$ of the power amplifier 750.

Please note that, each of the second power input signal SIN2, the second receiving signal SR2, and the designated output signal Sd is a complex signal, therefore, the second power input signal SIN2 can be represented by (Im, Qm), the second receiving signal SR2 can be represented by (Ir, Qr), and the designated output signal Sd can be represented by (Id, Qd). Due to the designated output signal Sd being the sum of the second power input signal SIN2 and the predetermined gain G, the designated output signal Sd can be represented by the following equations:

$$Id=Im+G \quad (2\text{-}1); \text{ and}$$

$$Qd=Qm+G \quad (2\text{-}2).$$

In other words, the abovementioned designated output signal Sd=(Id, Qd) can conform to the following equations:

$$Pd=20*\log 10(\sqrt{I_d^2+Q_d^2}) \quad (3\text{-}1); \text{ and}$$

$$\theta d=\arc\tan(Qd/Id) \quad (3\text{-}2).$$

In addition, the abovementioned second receiving signal SR2=(Ir, Qr) can conform to the following equations:

$$Pr=20*\log 10(I_r^2+Q_r^2) \quad (4\text{-}1); \text{ and}$$

$$\theta r=\arc\tan(Qr/Ir) \quad (4\text{-}2).$$

Herein Pd and θd respectively represent a power and a phase of the designated output signal Sd, and Pr and θr respectively represent a power and a phase of the second receiving signal SR2.

Therefore, the pre-distortion amplitude values $A_{PD}$ and the pre-distortion phase values $\theta_{PD}$ can respectively be represented by the following equations:

$$A_{PD}=Pd-Pr \quad (5\text{-}1); \text{ and}$$

$$\theta_{PD}=\theta_d-\theta_r \quad (5\text{-}2).$$

Please note that, the first power input signal SIN1 and the second power input signal SIN2 are signals inputted to the digital-to-analog converter, and the first receiving signal SR1 and the second receiving signal SR2 are signals outputted from the analog-to-digital converter, such that all of the first power input signal SIN1, the first receiving signal SR1, the second power input signal SIN2, and the second receiving signal SR2 are digital signals. In other words, the compensation device 300/400 disclosed in the present invention operates in a digital domain, but this in no way should be considered as a limitation of the present invention.

In simple words, the first power input signal SIN1 with a fixed amplitude intensity is first utilized for detecting the predetermined gain G of the power amplifier operating under the linear region. After that, the second power input signal SIN2 with different amplitude intensities and the abovementioned predetermined gain G are utilized for determining the plurality of pre-distortion amplitude values $A_{PD}$ and the plurality of pre-distortion phase values $\theta_{PD}$ of the power amplifier, wherein the plurality of pre-distortion amplitude values $A_{PD}$ constitute an amplitude curve (such as, the curve S1 shown in FIG. 2B), and the plurality of pre-distortion phase values $\theta_{PD}$ constitute a phase compensation curve (such as, the curve S4 shown in FIG. 2C). Furthermore, the plurality of pre-distortion amplitude values $A_{PD}$ and the plurality of pre-distortion phase values $\theta_{PD}$ can constitute a lookup table. In addition, one or a plurality of second pre-distortion amplitude value(s) $A_{PD}'$ can be further generated according to the plurality of pre-distortion amplitude values $A_{PD}$ by using an interpolation algorithm, and one or a plurality of second pre-distortion phase value(s) $\theta_{PD}'$ can be generated according to the plurality of pre-distortion phase values $\theta_{PD}$ by using the interpolation algorithm. Finally, a resultant pre-compensation circuit (or a pre-distortion circuit) is disposed in a front stage of the power amplifier. Hence, before an input signal is inputted into the power amplifier, the pre-compensation circuit will compensate the input signal in advance according to a target pre-distortion amplitude value and a target pre-distortion phase value by referring to the plurality of pre-distortion amplitude values $A_{PD}$ and the plurality of pre-distortion phase values $\theta_{PD}$ (or by referring to plurality of second pre-distortion amplitude value(s) $A_{PD}'$ and the plurality of second pre-distortion phase value (s) $\theta_{PD}'$). Be noted that, since the amplitude compensation curve S1 disclosed in the present invention is an inverse of the amplitude modulation distortion curve S2 of the power amplifier, and the phase compensation curve S4 disclosed in the present invention is an inverse of a phase modulation distortion curve S5 of the power amplifier, the resultant amplitude gain curve S3 and the result phase curve S6 generated after adding them together will have a fixed value. As a result, the problem that the power amplifier operates under the non-linear region can be solved.

Figure 10:
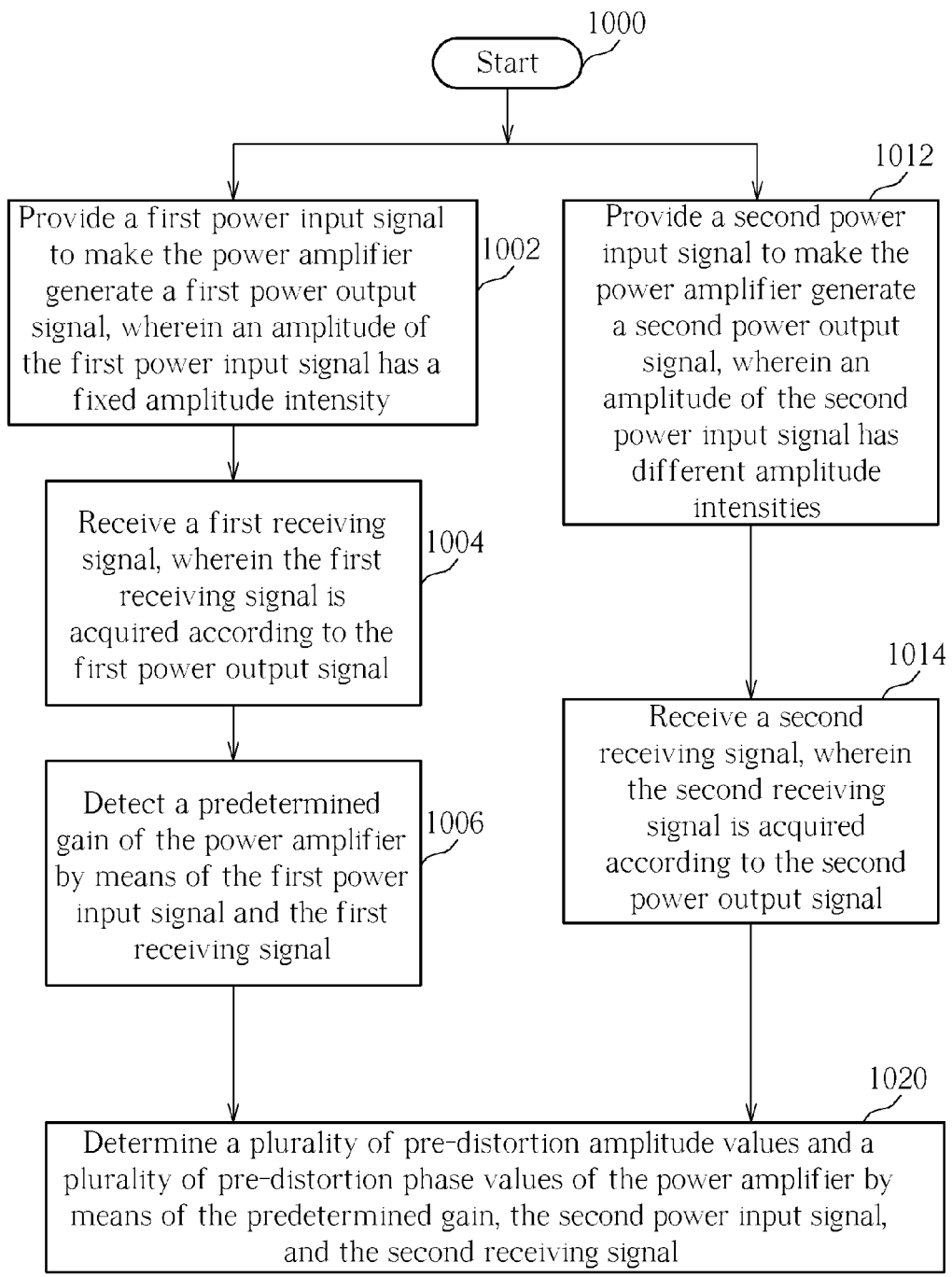
FIG. 10 is a flowchart illustrating a method for determining pre-distortion values of a power amplifier according to an exemplary embodiment of the present invention.

Please refer to FIG. 10. FIG. 10 is a flowchart illustrating a method for determining pre-distortion values of a power amplifier according to an exemplary embodiment of the present invention. Please note that the following steps are not limited to be performed according to the exact sequence shown in FIG. 10 if a roughly identical result can be acquired. The method includes, but is not limited to, the following steps:

Step 1000: Start.

Step 1002: Provide a first power input signal to make the power amplifier generate a first power output signal, wherein an amplitude of the first power input signal has a fixed amplitude intensity.

Step 1004: Receive a first receiving signal, wherein the first receiving signal is acquired according to the first power output signal.

Step 1006: Detect a predetermined gain of the power amplifier by means of the first power input signal and the first receiving signal.

Step 1012: Provide a second power input signal to make the power amplifier generate a second power output signal, wherein an amplitude of the second power input signal has different amplitude intensities.

Step 1014: Receive a second receiving signal, wherein the second receiving signal is acquired according to the second power output signal.

Step 1020: Determine a plurality of pre-distortion amplitude values and a plurality of pre-distortion phase values of the power amplifier by means of the predetermined gain, the second power input signal, and the second receiving signal.

How each element operates can be known by collocating the steps shown in FIG. 10 and the elements shown in FIG. 3, and further description is omitted here for brevity. Herein the steps 1002 and 1012 can be executed by the power signal generator 310 and the power amplifier 210, the steps 1004 and 1014 can be executed by the receiving circuit 320, the step 1006 can be executed by the gain detecting circuit 330, and the step 1020 can be executed by the pre-distortion determining circuit 340.

Figure 11:
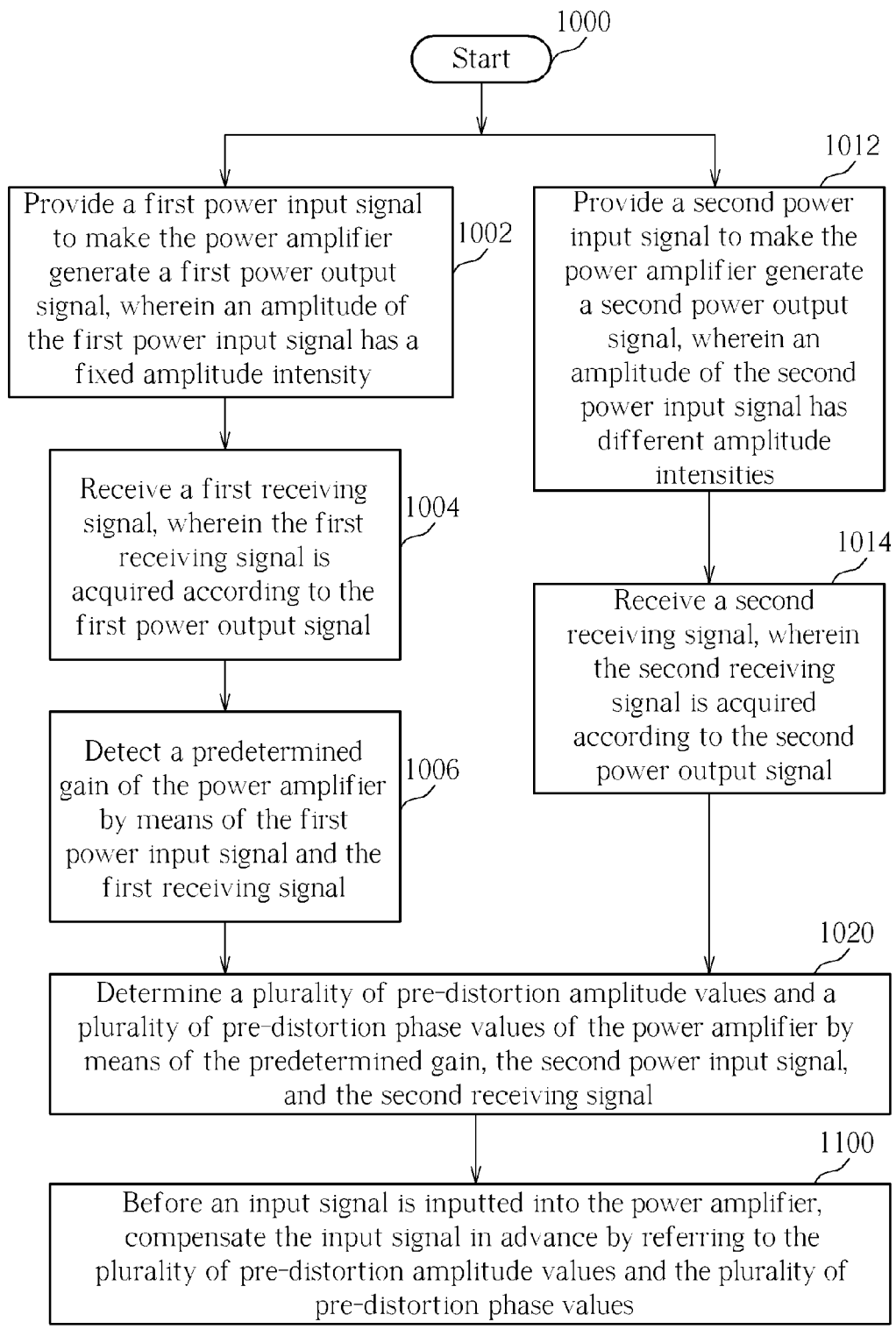
FIG. 11 is a flowchart illustrating a method for compensating linearity of a power amplifier according to an exemplary embodiment of the present invention.

Please refer to FIG. 11. FIG. 11 is a flowchart illustrating a method for compensating linearity of a power amplifier according to an exemplary embodiment of the present invention. The method may include, but is not limited to, the following steps:

Step 1000: Start.

Step 1002: Provide a first power input signal to make the power amplifier generate a first power output signal, wherein an amplitude of the first power input signal has a fixed amplitude intensity.

Step 1004: Receive a first receiving signal, wherein the first receiving signal is acquired according to the first power output signal.

Step 1006: Detect a predetermined gain of the power amplifier by means of the first power input signal and the first receiving signal.

Step 1012: Provide a second power input signal to make the power amplifier generate a second power output signal, wherein an amplitude of the second power input signal has different amplitude intensities.

Step 1014: Receive a second receiving signal, wherein the second receiving signal is acquired according to the second power output signal.

Step 1020: Determine a plurality of pre-distortion amplitude values and a plurality of pre-distortion phase values of the power amplifier by means of the predetermined gain, the second power input signal, and the second receiving signal.

Step 1100: Before an input signal is inputted into the power amplifier, compensate the input signal in advance according to a target pre-distortion amplitude value and a target pre-distortion phase value by referring to the plurality of pre-distortion amplitude values and the plurality of pre-distortion phase values.

How each element operates can be known by collocating the steps shown in FIG. 11 and the elements shown in FIG. 4, and further description is omitted here for brevity. What calls for special attention is that: the steps shown in the flowchart of FIG. 11 are similar to the steps shown in the flowchart of FIG. 10, and the difference between them being that the flowchart of FIG. 11 further includes a pre-compensation step (e.g., the step 1100), which can be executed by the pre-compensation circuit 430 shown in FIG. 4.

Please note that, the steps of the abovementioned flowcharts are merely practicable embodiments of the present invention, and in no way should be considered to be limitations of the scope of the present invention. These methods can include other intermediate steps or several steps can be merged into a single step without departing from the spirit of the present invention.

The abovementioned embodiments are presented merely to illustrate practicable designs of the present invention, and in no way should be considered to be limitations of the scope of the present invention. In summary, a compensation device applied to a power amplifier and a related method are provided in the present invention. First, by using the first power input signal SIN1 with a fixed amplitude intensity, the predetermined gain G of the power amplifier operating under the linear region can be detected. After that, by using the second power input signal SIN2 with different amplitude intensities and the detected predetermined gain G, the plurality of pre-distortion amplitude values $A_{PD}$ and the plurality of pre-distortion phase values $\theta_{PD}$ of the power amplifier can be determined. As a result, an amplitude compensation curve can be constituted by using the plurality of pre-distortion amplitude values $A_{PD}$, and a phase compensation curve can be constituted by using the plurality of pre-distortion phase values $\theta_{PD}$. Herein, the plurality of pre-distortion amplitude values $A_{PD}$ and the plurality of pre-distortion phase values $\theta_{PD}$ can constitute a lookup table. In addition, one or a plurality of second pre-distortion amplitude value(s) $A_{PD}'$/second pre-distortion phase value(s) $\theta_{PD}'$ can be further generated according to the plurality of pre-distortion amplitude values $A_{PD}$/pre-distortion phase values $\theta_{PD}$ by using an interpolation algorithm. Hence, before an input signal is inputted into the power amplifier, the pre-compensation circuit will compensate the input signal in advance by referring to the plurality of pre-distortion amplitude values $A_{PD}$ and the plurality of pre-distortion phase values $\theta_{PD}$ (or by referring to plurality of second pre-distortion amplitude value(s) $A_{PD}'$ and the plurality of second pre-distortion phase value(s) $\theta_{PD}'$). Therefore, the problem that the power amplifier operates under the non-linear region can be solved in order to avoid harmonics and further improve the communication quality. Moreover, the mechanism disclosed in the present invention can operate at a digital domain, which has a simpler implementation structure.

Those skilled in the art will readily observe that numerous modifications and alterations of the device and method may be made while retaining the teachings of the invention.

What is claimed is:

1. A compensation device applied to a power amplifier, the compensation device comprising:
a power signal generator, arranged to provide a first power input signal with a fixed amplitude intensity to the power amplifier, and arranged to provide a second power input signal with different amplitude intensities to the power amplifier, wherein the power amplifier generates a first power output signal according to the first power input signal, and generates a second power output signal according to the second power input signal;
a receiving circuit, arranged to receive a first receiving signal and a second receiving signal, wherein the first receiving signal is corresponding to the first power output signal, and the second receiving signal is corresponding to the second power output signal;
a gain detecting circuit, coupled to the power signal generator and the receiving circuit, arranged to detect a predetermined gain of the power amplifier by means of the first power input signal and the first receiving signal; and
a pre-distortion determining circuit, coupled to the power signal generator, the receiving circuit, and the gain detecting circuit, arranged to determining a plurality of pre-distortion amplitude values and a plurality of pre-distortion phase values of the power amplifier by means of the predetermined gain, the second power input signal and the second receiving signal.

2. The compensation device of claim 1, wherein the power amplifier operates under a linear region to generate the first power output signal.

3. The compensation device of claim 1, further comprising:
a lookup table, coupled to the pre-distortion determining circuit, composed of the plurality of pre-distortion amplitude values and the plurality of pre-distortion phase values.

4. The compensation device of claim 3, further comprising:
an interpolation operating circuit, coupled to the lookup table, arranged to generate a second pre-distortion amplitude value according to the plurality of pre-distortion amplitude values by using an interpolation algorithm, and arranged to generate a second pre-distortion phase value according to the plurality of pre-distortion phase values by using the interpolation algorithm.

5. The compensation device of claim 3, further comprising:
a pre-compensation circuit, disposed in a front stage of the power amplifier and coupled to the lookup table, wherein before an input signal is inputted into the power amplifier, the pre-compensation circuit compensates the input signal in advance according to a target pre-distortion amplitude value and a target pre-distortion phase value by referring to the plurality of pre-distortion amplitude values and the plurality of pre-distortion phase values.

6. The compensation device of claim 1, wherein the plurality of pre-distortion amplitude values constitute an amplitude compensation curve, and the plurality of pre-distortion phase values constitute a phase compensation curve; and the amplitude compensation curve is an inverse of an amplitude modulation distortion curve of the power amplifier, and the phase compensation curve is an inverse of a phase modulation distortion curve of the power amplifier.

7. The compensation device of claim 1, wherein an amplitude of the second power input signal has an increasing amplitude intensity or a decreasing amplitude intensity.

8. The compensation device of claim 1, wherein the gain detecting circuit is represented by the following equation:

$$G = P_{R1} - P_{IN1};$$

wherein G represents the predetermined gain of the power amplifier, $P_{R1}$ represents a power of the first receiving signal, and $P_{IN1}$ represents a power of the first power input signal.

9. The compensation device of claim 1, wherein the pre-distortion determining circuit comprises:
a designated output signal generator, arranged to obtain a designated output signal according to the predetermined gain and the second power input signal, wherein the designated output signal is a sum of the second power input signal and the predetermined gain; and
a computing unit, arranged to perform a subtraction upon the designated output signal and the second receiving signal in order to obtain the plurality of pre-distortion amplitude values and the plurality of pre-distortion phase values of the power amplifier.

10. The compensation device of claim 9, wherein each of the second power input signal, the second receiving signal, and the designated output signal is a complex signal; the second power input signal is represented by (Im, Qm), the second receiving signal is represented by (Ir, Qr), and the designated output signal is represented by (Id, Qd); and Id=Im+G, Qd=Qm+G, where G represents the predetermined gain of the power amplifier.

11. The compensation device of claim 10, wherein:
the designated signal (Id, Qd) conforms to the following equations:

$$Pd=20*\log 10(\sqrt{I_d^2+Q_d^2});$$

$$\theta d=\text{arc tan}(Qd/Id);$$

the second receiving signal (Ir, Qr) conforms to the following equations:

$$Pr=20*\log 10(I_r^2+Q_r^2);$$

$$\theta r=\text{arc tan}(Qr/Ir);$$

Pd and θd respectively represent a power and a phase of the designated output signal, and Pr and θr respectively represent a power and a phase of the second receiving signal;
the pre-distortion amplitude value $A_{PD}$ and the pre-distortion phase value $\theta_{PD}$ of the power amplifier are respectively represented by the following equations:

$$A_{PD}=Pd-Pr;\text{ and}$$

$$\theta_{PD}=\theta d-\theta r.$$

12. A method for determining pre-distortion values of a power amplifier, comprising:
providing a first power input signal to make the power amplifier generate a first power output signal, wherein an amplitude of the first power input signal has a fixed amplitude intensity;
receiving a first receiving signal, wherein the first receiving signal is acquired according to the first power output signal;
detecting a predetermined gain of the power amplifier by means of the first power input signal and the first receiving signal;
providing a second power input signal to make the power amplifier generate a second power output signal, wherein an amplitude of the second power input signal has different amplitude intensities;
receiving a second receiving signal, wherein the second receiving signal is acquired according to the second power output signal; and
determining a plurality of pre-distortion amplitude values and a plurality of pre-distortion phase values of the power amplifier by means of the predetermined gain, the second power input signal, and the second receiving signal.

13. The method of claim 12, wherein the power amplifier operates under a linear region to generate the first power output signal.

14. The method of claim 12, wherein the plurality of pre-distortion amplitude values constitute an amplitude compensation curve, and the plurality of pre-distortion phase values constitute a phase compensation curve; and the amplitude compensation curve is an inverse of an amplitude modulation distortion curve of the power amplifier, and the phase compensation curve is an inverse of a phase modulation distortion curve of the power amplifier.

15. The method of claim 12, wherein the step of determining the plurality of pre-distortion amplitude values and the plurality of pre-distortion phase values of the power amplifier by means of the predetermined gain, the second power input signal, and the second receiving signal comprises:
acquiring a designated output signal according to the predetermined gain and the second power input signal, wherein the designated output signal is a sum of the second power input signal and the predetermined gain; and
determining the plurality of pre-distortion amplitude values and the plurality of pre-distortion phase values of the power amplifier according to the designated output signal and the second receiving signal.

* * * * *